United States Patent
Smith et al.

(10) Patent No.: US 7,218,696 B2
(45) Date of Patent: May 15, 2007

(54) SYNCHRONIZING CARRIER FREQUENCIES OF CO-CHANNEL AMPLITUDE-MODULATED BROADCAST

(75) Inventors: Stephen F. Smith, London, TN (US); James A. Moore, Powell, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 823 days.

(21) Appl. No.: 10/304,338

(22) Filed: Nov. 26, 2002

(65) Prior Publication Data

US 2003/0112907 A1 Jun. 19, 2003

Related U.S. Application Data

(63) Continuation of application No. 09/860,841, filed on May 17, 2001, now Pat. No. 6,563,893.

(51) Int. Cl.
*H04L 7/00* (2006.01)
*H04L 25/40* (2006.01)

(52) U.S. Cl. ........................ 375/356; 375/371

(58) Field of Classification Search ................ 375/145, 375/149, 211–215, 268, 320, 354, 356, 376, 375/371; 370/204, 503; 348/423.1; 386/119
See application file for complete search history.

(56) References Cited

U.S. PATENT DOCUMENTS

| 4,208,630 | A |   | 6/1980 | Martinez ........................ 375/7 |
| 4,322,842 | A | * | 3/1982 | Martinez ..................... 370/204 |
| 4,517,562 | A |   | 5/1985 | Martinez ................ 340/825.52 |
| 5,065,450 | A |   | 11/1991 | Wu et al. ....................... 455/20 |
| 5,133,081 | A | * | 7/1992 | Mayo ........................... 455/18 |
| 5,216,717 | A |   | 6/1993 | Bourcet et al. ................ 381/3 |
| 6,178,194 | B1 | * | 1/2001 | Vasic ......................... 375/136 |
| 6,212,397 | B1 |   | 4/2001 | Langston et al. ............. 455/50 |

OTHER PUBLICATIONS

PCT International Search Report date mailed Sep. 18, 2002.

* cited by examiner

*Primary Examiner*—Don N. Vo
(74) *Attorney, Agent, or Firm*—John Bruckner PC

(57) ABSTRACT

Systems and methods are described for carrier-frequency synchronization for improved AM and TV broadcast reception. A method includes synchronizing a carrier frequency of a broadcast signal with a remote reference frequency. An apparatus includes a reference signal receiver; a phase comparator coupled to the reference signal receiver; a voltage controlled oscillator coupled to the phase comparator; and a radio frequency output coupled to the voltage controlled oscillator.

42 Claims, 7 Drawing Sheets

SYNCHRONIZING CARRIER FREQUENCIES OF CO-CHANNEL AMPLITUDE-MODULATED BROADCAST

CROSS-REFERENCE TO RELATED APPLICATION

This application is a continuation of, and claims a benefit of priority under 35 U.S.C. 120 of the filing date of U.S. patent application Ser. No. 09/860,841 by inventors Stephen F. Smith and James A. Moore entitled "Carrier-Frequency Synchronization System for Improved Amplitude Modulation and Television Broadcast Reception" filed on May 17, 2001 now U.S. Pat. No. 6,563,893, the entire contents of which are hereby expressly incorporated by reference for all purposes.

STATEMENT AS TO RIGHTS TO INVENTIONS MADE UNDER FEDERALLY SPONSORED RESEARCH AND DEVELOPMENT

This invention was made with United States Government support awarded by the United States Department of Energy under contract to UT-Battelle, LLC. The United States has certain rights in this invention.

BACKGROUND OF THE INVENTION

1. Field of the Invention

The invention relates generally to the field of communications. More particularly, the invention relates to AM and TV broadcast communications.

2. Discussion of the Related Art

In standard broadcast communications, numerous stations co-operate or share common broadcast channels. Typically, the Federal Communications Commission (FCC) allocates stations on a given channel in geographically separated parts of the country, so that to avoid objectionable interference, co-channel stations are typically separated by hundreds or even thousands of miles, depending on the type of station (AM or TV), the type of channel (local, regional, or long-range for AM broadcasting), and the various stations' transmitting power levels.

Perhaps the major source of interference to broadcasting stations of these types are the co-channel signals from similar stations in adjacent areas of the country. In television, the co-channel distant video carrier (which is amplitude-modulated as well) causes the generation of diagonal interference patterns ("herringbone") in the picture, plus often a visible, horizontally oriented "sync-bar" which very slowly drifts vertically in the received display. To minimize the severity of these effects when the two carriers were very close to the same frequency, the FCC long ago mandated that geographically adjacent TV stations offset their carrier frequencies from each other by roughly 10 kHz, to keep the magnitude of the resulting interference pattern to fringe-area viewers acceptably low. However, this scheme is practical only because of the considerable width (6 MHz) of the TV channels; no such separation is feasible for amplitude-modulated (AM) radio stations, whose channel allocations are only 10 kHz in total width! Traditionally, the FCC has required that AM broadcast stations operate within ±20 Hz of their assigned carrier frequencies, which theoretically permits difference-frequency beats between co-channel stations of up to 40 Hz. Typically, the stations operate at much smaller frequency errors; beat frequencies are generally below 5 Hz, and are sometimes even below 1 Hz. Unfortunately, in areas that are located far from the local transmitter (i.e., the desired station), distant station carrier-beat components usually cause fast fluttering-type modulations of, and/or large-amplitude swishing sounds in, the desired station's audio at the receiver and concurrent distortion of the audio modulation from the distant station(s), even if they are sub-Hertz in nature, since the received desired station's carrier's amplitude and phase are noticeably modulated by the distant station's carrier signals.

AM radio receivers are virtually always provided with automatic gain-control circuitry. However, the typical AM radio receiver's automatic gain-control (AGC), also called "automatic volume control" ("AVC"), usually responds far too slowly to "average out" or suppress these beat modulations; thus, these highly annoying modulation effects are largely passed on intact to the listener.

These beat-related effects are the principal factor in the degradation of evening and nighttime AM fringe-area reception quality and the resulting loss of listeners for virtually all AM stations. As discussed above, the corresponding effect among co-channel television stations leads to beats of roughly 10 kHz rate which cause faint but often noticeable diagonal interference lines from a distant station in the picture broadcast from a more local station.

Heretofore, the requirements of reducing co-channel interference and mitigating beat frequency related effects have not been fully met. Therefore, what is needed is a solution that reduces co-channel interference and mitigates beat-related effects, preferably for both radio and television.

SUMMARY OF THE INVENTION

There is a need for the following embodiments. Of course, the invention is not limited to these embodiments.

According to a first aspect of the invention, a method comprises: synchronizing a carrier frequency of a broadcast signal with a remote reference frequency. According to a second aspect of the invention, an apparatus comprises: a reference signal receiver; a phase comparator coupled to the reference signal receiver; a voltage-controlled oscillator coupled to the phase comparator; and a radio-frequency (RF) output coupled to the voltage-controlled oscillator.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DESCRIPTION OF PREFERRED EMBODIMENTS

Figure 1:
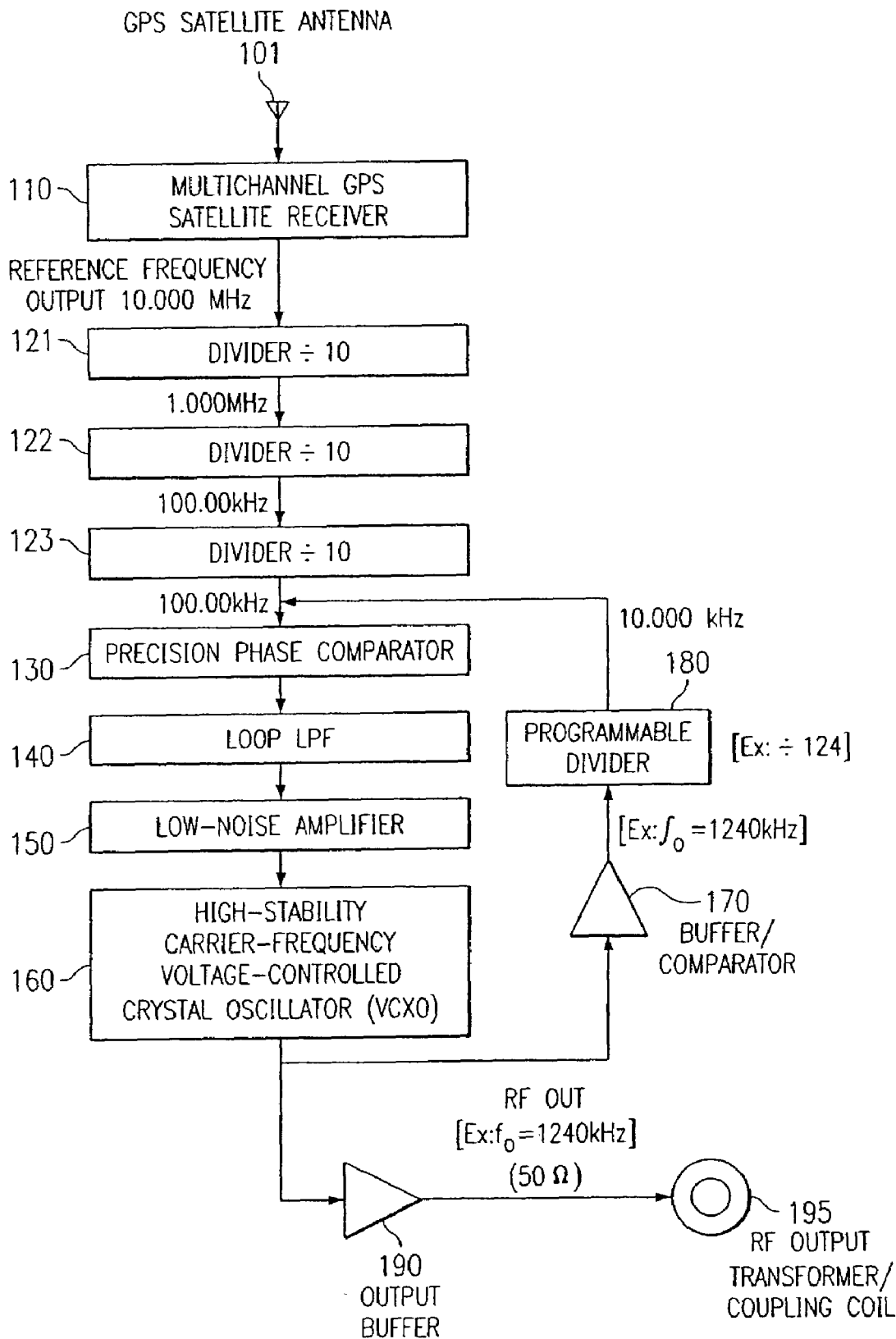
FIG. 1 illustrates a schematic block diagram of a basic configuration of a high-accuracy, near-zero-drift single-loop Global Positioning System (GPS)-corrected or disciplined carrier oscillator system with a direct, on-frequency control circuit, representing an embodiment of the invention.

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this detailed description.

The invention can include synchronizing a broadcast signal to a remote reference frequency. The phrase remote reference frequency, as used herein, is defined as a frequency or time standard, either primary or secondary, that originates from a non-proximal location. The invention can include a highly accurate carrier-frequency synchronization scheme for actively, automatically locking multiple, remotely located AM radio broadcast transmitters to a common, remote frequency/timing reference source. The invention can include a common reference source which is local to one station of a group but remote to the others. This source can also include a method of transmission to send frequency and/or timing data or signals to other stations in the group. The invention can include the use of a common frequency/timing reference source from the GPS satellite constellation. The invention can include an antenna, a receiver, a precision phase comparator and an RF output adapted to control, at least in-part, a transmitter.

Suitably stable reference sources other than GPS can alternatively be employed, including signals from WWVB, LORAN-C, OMEGA, digital data networks, and other sources such as GOES satellites, CDMA cell-phone base stations, and (with appropriate averaging techniques) one of several VLF, LF, or HF standard-frequency broadcast signals including WWV, WWVH, CHU, NAA, NLK, NSS, NPM, etc. In general, the stability of the VLF and LF signals (~1 part in $10^{10}$ to $10^{11}$) markedly exceeds those of the HF stations (~1 part in $10^7$). The reference sources may be local, wide-area, or global in nature, and may include analog and/or digital timing mechanisms. In addition, the synchronization application is straightforward to standard NTSC television broadcasting and should even benefit the newer digital television (DTV) formats by reducing the effective video data-error rate due to co-channel TV stations in areas of low signal-to-noise ratio (SNR) and/or high interference near the threshold of signal drop-out.

It is instructive to examine how the phases/delays of the audio and RF components of the signal can affect reception quality in the field, particularly in signal-overlap regions. For instance, the RF signal delay is very roughly 1 millisecond for 186 miles (corresponding to the speed of light in air). At a point equidistant from two omnidirectional transmitters with equal power and propagating via groundwave mode over land paths of identical RF conductivity, the two RF signals will arrive with nearly equal delays (phases). Now if we assume that the RF carriers and the sideband audio signals are precisely in phase (matched in time) as they leave the two antennas, at the exact midpoint between the two transmitters the RF signals and the detected audio will also be in phase; the signals can be added algebraically to calculate the resultant. Now for points not equidistant from the two transmitters, the RF signals will vectorially add; in general, there will be augmentations and cancellations of the two waves occurring at spatial intervals of one-half wavelength, essentially the same as is the case for standing waves on a mismatched transmission line.

Figure 3:
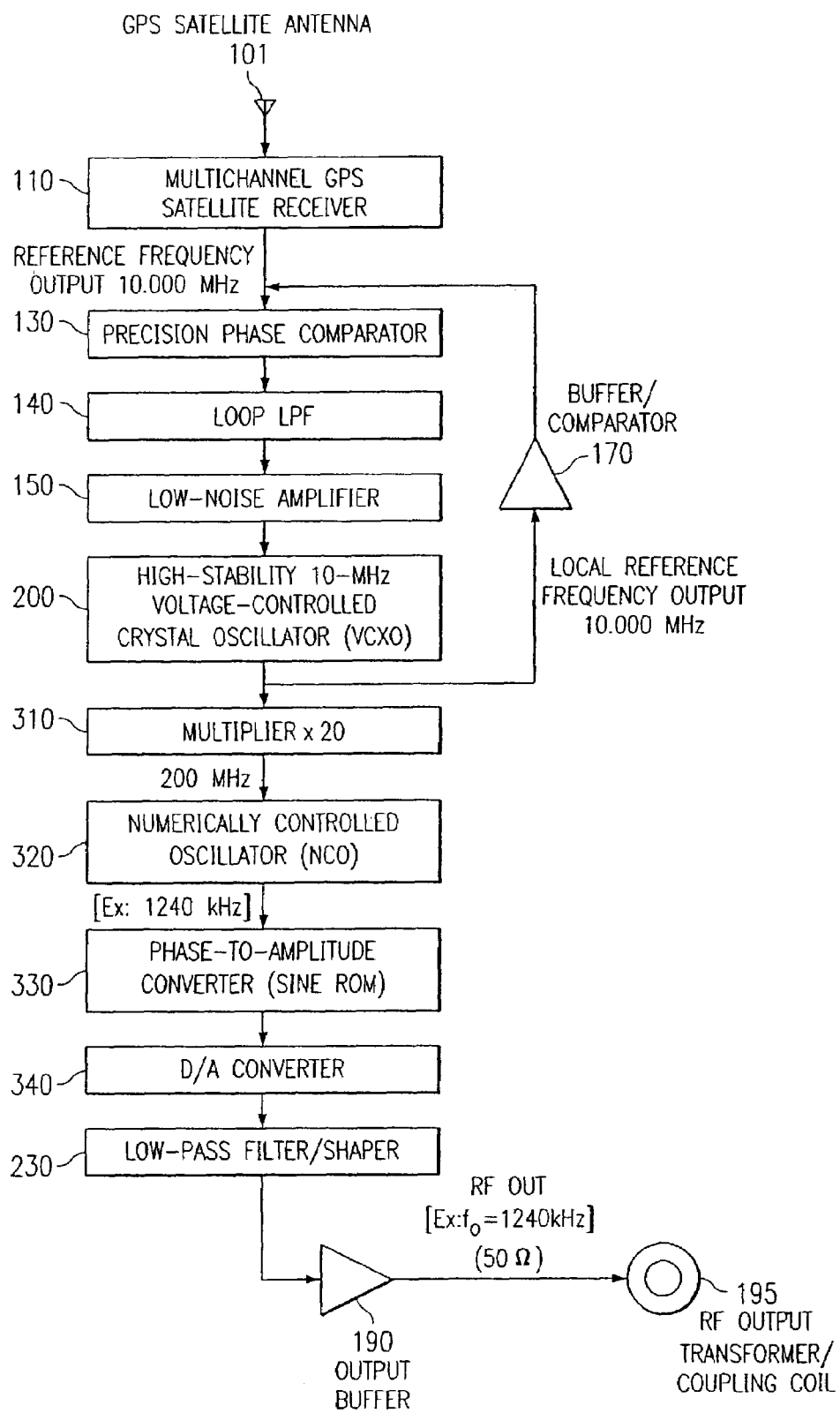
FIG. 3 illustrates a schematic block diagram of a basic configuration of a high-accuracy, near-zero-drift, single-loop GPS-disciplined carrier-frequency generator with a direct-digital synthesizer (DDS) circuit, representing an embodiment of the invention.
Figure 4:
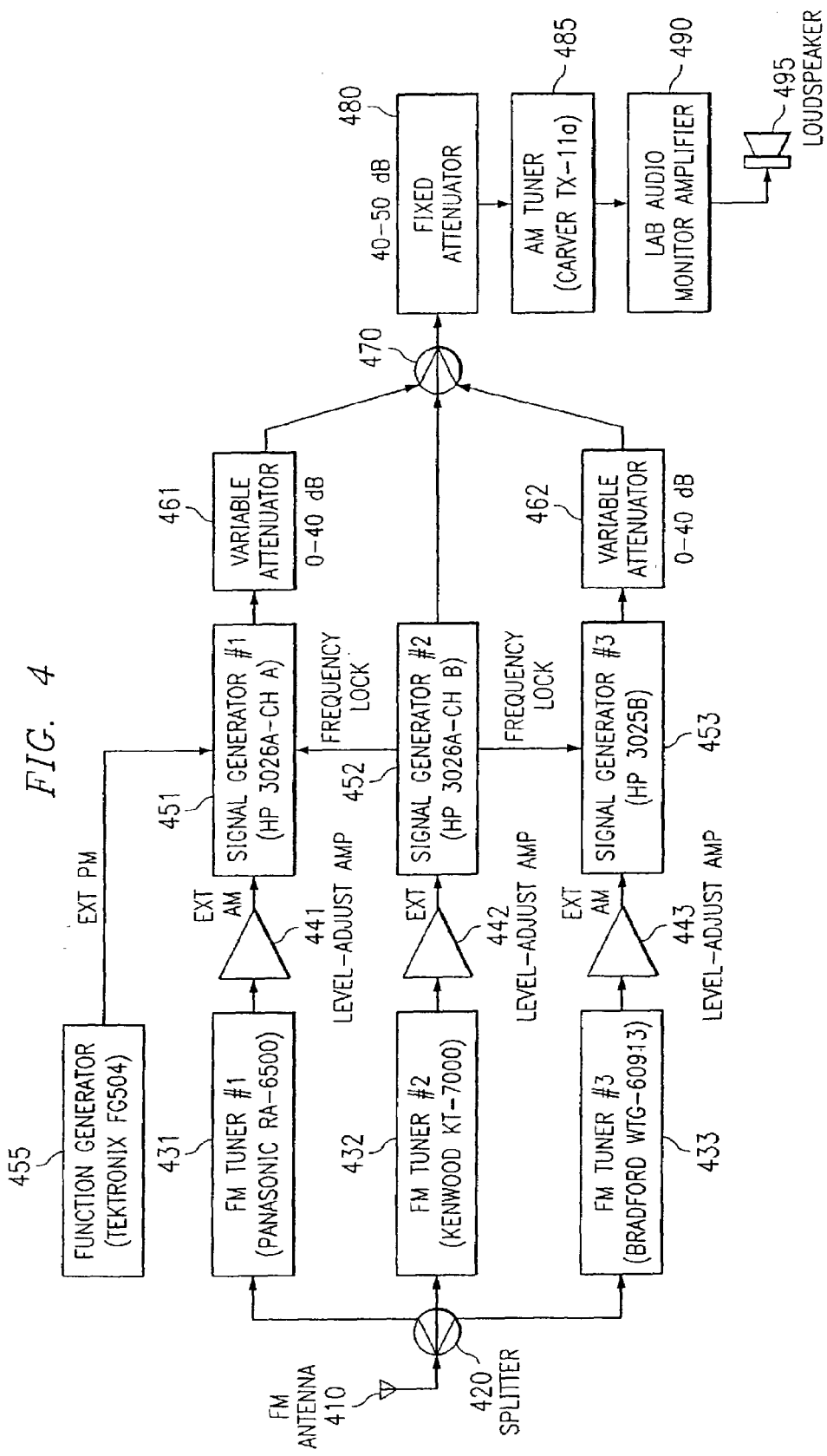
FIG. 4 illustrates a schematic block diagram of a basic configuration of a multiple (3) transmitter simulation system with high-accuracy, audio-modulated carrier-frequency generators, representing an embodiment of the invention.

Referring to FIG. 4, the effectiveness of the synchronization concept for AM broadcasting was demonstrated with a laboratory test setup. Other embodiments of the invention will be discussed below with reference to FIGS. 1–3.

Referring again to FIG. 4, an FM antenna 410 is connected to a 3-way splitter 420. Three different FM broadcast tuners 431, 432 and 433 are coupled to the 3-way splitter 420. Each of the tuners 431, 432 and 433 is coupled to an audio level-adjust amp 441, 442 and 443, respectively. Each of the amps 441, 442 and 443 is coupled to a signal generator 451, 452 and 453, respectively. A function generator 455 is coupled to the signal generator 451. The signal generator 451 is coupled to a 3-way combiner 470 via a variable attenuator 461. The signal generator 452 is coupled to the 3-way combiner 470. The signal generator 453 is coupled to the 3-way combiner 470 via a variable attenuator 462. The 3-way combiner 470 is coupled to an AM tuner 485 via a fixed attenuator 480. The monitoring AM tuner is coupled to a loudspeaker 495 via a laboratory audio monitor amplifier 490.

Still referring to FIG. 4, the laboratory test setup employed three externally modulatable frequency-synthesized signal generators for 451, 452, and 453. The "B" channel of a high-performance synthesized two-channel signal generator, the Hewlett-Packard model 3326A, was used as the reference ("local") AM station; the "A" side was set up as one of two "interfering" co-channel stations. The other "interferer" was simulated by a separate single-channel synthesized Hewlett-Packard 3325B generator. All three generator units were commonly locked to a high-stability ovenized 10.000-MHz clock within the 3326A chassis. For the test, all units were nominally set to 1000 kHz (1.000 MHz), as was the superb-quality Carver TX-11a audiophile AM Stereo/FM Stereo tuner which was used to demodulate the combined signals and feed an external lab monitoring amplifier/speaker system. The generator outputs were all set at a nominal 0-dBm output level (50 ohms) and fed to a three-input passive RF power combiner (a Mini-Circuits Labs type ZSC-4-1). The combiner's 50-$\Omega$ output was attenuated about 40–50 dB before being fed to the RF antenna input of the high-quality tuner, which itself was terminated and de-sensitized by a 50-$\Omega$ resistor. Lacking equipment to generate the FCC-standard CQUAM AM stereo signals, the tests were all conducted with monaural (standard) audio modulation. Three consumer-grade FM broadcast tuners (431, 432, and 433) were set to three different Knoxville/Oak Ridge area stations to obtain reasonably clean, peak-limited audio sources to modulate the three AM generators via their external-AM audio inputs. The main generator was fed directly to the AM signal combiner, while each of the two "interferers" was connected through a pair of switchable step attenuators, one with 10-dB steps and the other with 1-dB increments. Many hours of careful subjective listening were conducted, with the two interfering units both precisely on-frequency with the main unit (synchronous operation) and with the two interferers at various frequency offsets, from below 1 Hz to above 10 Hz. The most audibly annoying beats were generally judged to be below roughly 2 Hz, so several tests were conducted with offsets of 0.7 and 1.7 Hz, respectively, which tend to more closely emulate current typical AM broadcast channel beat characteristics.

Figure 5:
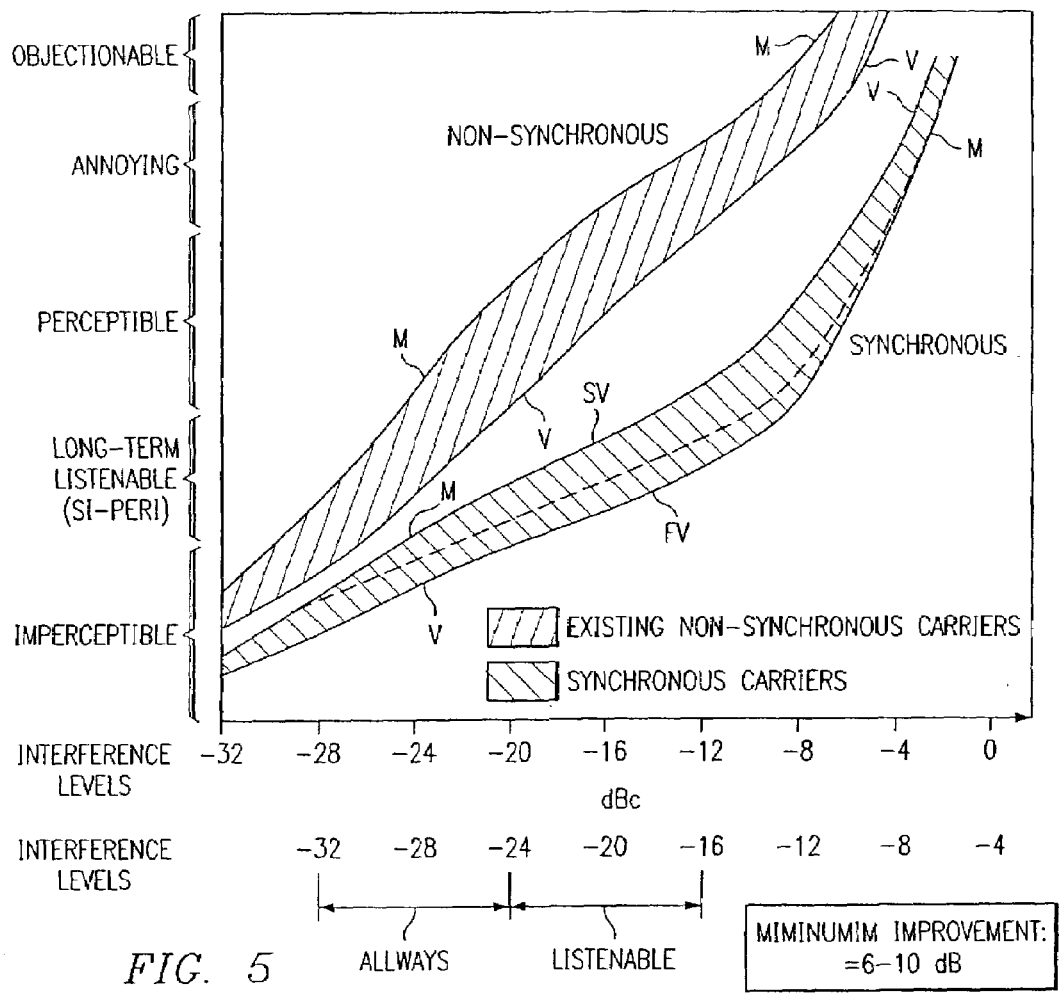
FIG. 5 illustrates a graphical comparison of the subjective effects of the low-frequency carrier-frequency beats in a standard (non-synchronous) AM transmitting scenario versus a fully synchronized case, representing an embodiment of the invention.

Referring to FIG. 5, subjective measurements to determine the familiar audible interference assessment criteria of "imperceptible", "perceptible", "annoying", and "objectionable" were made and documented. An extra sub-category within the "perceptible" bracket, denoted "long-term-listenable" ("slightly perceptible"), was added to assist in estimating a listening quality level adequate to avoid "tune-outs" caused by carrier beats and other background interference. For this test campaign, impulse noises such as from lightning were deemed out of the scope of this effort and were therefore not included. To help simulate significant nighttime ionospheric phase/propagation-delay shifts, in both synchronous and non-synchronous scenarios, an auxiliary low-frequency function generator was added to externally phase-modulate the larger interferer's signal at rates varying from 0.5 Hz to below 0.01 Hz (a 100-second period); the usual periods of fading were from 10 to 30 seconds, following past experience of the inventors. Obviously, the interference in the standard (non-synchronous) case consists of both carrier beats and background co-channel audio modulations, while in the synchronous setup the beats are absent. At low signal-to-interference ratios (SIRs), i.e., below about 12 dB, the beats are highly annoying and cause gross intermodulation of the received audio program. At much higher SIRs approaching 30 dB, even the non-synchronized beats become imperceptible to most listeners. At intermediate SIR levels, the effects are strongly dependent on the exact nature of the three audio modulation signals, due to masking of lower-level sounds by louder concurrent ones in the human auditory system. Slightly different results are therefore obtained for fast ("pop") to slow music [M], average voice [V], fast-paced voice [FV] (e.g., commercial advertisements) and slow-tempo voice [SV] (e.g., telephone-talk shows). Overall, the net advantage to the listener of synchronizing the AM carriers and thereby eliminating the beats is on average about 6 dB minimum and can often be as great as 10 dB; this is of major importance in evening and nighttime situations where the SIR due to incoming skywave signals can degrade to levels of 12 dB or worse. Thus, with synchronization, interfering signals from co-channel stations may be from 6 to 10 dB higher (for comparable audibility) than in the current non-synchronized scenario. The net result is that a listener may be at a position where the SIR is 6–10 dB worse (i.e., at roughly twice to three times the distance from the desired station) before the interference becomes annoying, as compared with the present situation. Even at an 8-dB SIR, when the carrier beats from unsynchronized stations are totally objectionable, interference from well-synchronized remote signals can be masked surprisingly well by highly modulated audio from the stronger ("local") station and thus render a reasonably listenable signal.

Figure 6:
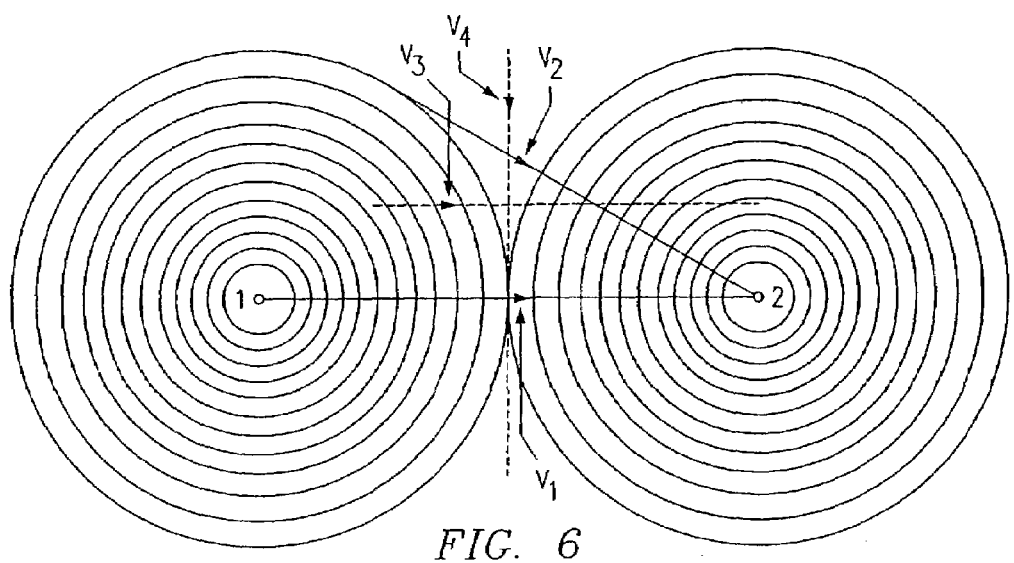
FIG. 6 illustrates a schematic plan view of various cases of a moving receiver in the overlapping fields of two synchronous co-channel transmitters, representing an embodiment of the invention.

Referring to FIG. 6, field contours of two overlapping synchronous (co-channel) AM transmitters are depicted with typical mobile-receiver trajectories. For a listener traveling in a path connecting two 1.0-MHz transmitters at a velocity of 30 m/s (about 67 mph), as shown on trajectory $V_1$ of FIG. 6, these signal minima will appear at an interval of (150 m)÷(30 m/s)=5 s, or at a rate of 0.2 Hz. For the typical automobile AM radio receiver with an effective automatic gain-control (AGC) loop bandwidth of roughly 10 to 20 Hz, this 0.2-Hz variation will be easily leveled out by the AGC loop so long as there is sufficient residual gain in the receiver to amplify the resultant signal at these partial null-points. For velocity vectors at other angles from the transmitters, the standing-wave amplitude-oscillation intervals will be longer by a factor of the inverse of the cosine of the angle from the direct or radial path; for instance, if the path is at 45° from the radial, the oscillation period will be (5 s)÷(cos 45°)=5/0.707=7.07 s. For example, on trajectory $V_2$ of FIG. 6, the receiver is moving tangentially with respect to Station ①  but radially toward Station 2 . Thus there will be no relative beats in the receiver from signal ①, but the maximum beat-frequency (for that velocity) of +0.1 Hz will be observed for signal 2 . For paths which are neither tangential or radial to either transmitter, such as $V_3$ of FIG. 6, both beats will be present but will be of intermediate frequencies (i.e., |$f_{beat}$|<0.1 Hz). For velocity paths essentially perpendicular to the radial (cos 90°=0), as on path $V_4$ of FIG. 6, the oscillations will be of very long periods and of vanishing amplitudes. Although theoretically there will be cancellation nulls of great depth at many discrete points in the field of the two transmitters, in reality the nulls will only be partial, due to local variabilities in the amplitude and phase of the transmitted ground waves, scattering effects, and diffraction over hills and other large terrain features. If the receiver gain range is sufficient to compensate for a null depth of about 20–30 dB worst case, the audible effects will usually be negligible.

Another way of describing this effect is that of Doppler-induced carrier-frequency shifts in moving (vehicle) receivers. For the aforementioned scenario, where a vehicle is moving at 30 m/s on a linear path between two frequency-locked stations (path $V_1$) at 1.0 MHz, the apparent frequency of the transmitter being approached will be shifted upward by $(3\times10^1 \text{ m/s}) \div (3\times10^8 \text{ m/s}) \times (10^6 \text{ Hz}) = 0.1$ Hz, while the transmitter being receded from will exhibit an apparent downward shift of 0.1 Hz. The net result will be an observed offset of 0.2 Hz between the two carriers, with the attendant beat. The effective beat frequency with respect to each station will thus be a function of the product of vehicle speed, the cosine of the velocity-vector angle with the radial from the station, and the true transmitted RF carrier frequency. Equivalently, the Doppler shift from each station (① or ②) is the product of the radial component of the relative vehicle velocity (referred to the specific transmitter) and the carrier frequency, divided by the speed of light (or RF) in the atmosphere. The total composite beat frequency is simply the sum of the two Doppler shifts (for both ① and ②). In general, the path on the common radial will produce the worst-case (highest) beat frequency; ideally, a path perpendicular to that line will produce no beats, since the Doppler shifts of each station will be equal in magnitude and sign and thus cancel at the moving receiver. The mathematical equations are thus:

$$f_{beat(total)} = \sum_n f_{beat(n)} \qquad (1)$$

$$f_{beat(n)} = (v_{Rn} \cos\theta_n)(f_0/c) \qquad (2)$$

where $f_{beat(n)}$ is the nth beat frequency in Hz, $v_{Rn}$ is the velocity in m/s relative to station n, $\theta_n$ is the angle of the trajectory from the radial from station n, $f_0$ is the original carrier frequency in Hz, n is the number of received co-channel stations, and c is the speed of light in m/s. Thus the combined beat signal is merely the sum of the Doppler frequency components due to the relative radial velocities with respect to each station, times the inverse of the nominal RF wavelength.

A significant consequence of this Doppler effect is the low-frequency beat-modulation of the audio envelope in mobile receivers (none of this occurs for fixed radios), but several factors ameliorate the situation in real automobile listening environments. First, the apparent modulation from near 0 to 0.3 Hz (typically less than 0.2 Hz) is largely suppressed by the action of the radio's internal feedback AGC circuitry, which rapidly and effectively levels these slow amplitude variations to maintain a fairly constant detected carrier magnitude. Second, the presence of relatively high levels of ambient "road noise" in the vehicle at higher speeds, particularly in the low-frequency region of the audible spectrum, serves to mask these cyclic but low-level variations. Third, local RF field irregularities also cause overall level variations which "dither" (randomly modulate) these cyclic field variations; these variations also tend to mask the beats. When the vehicle slows and thus produces less road noise to mask the beats, their frequencies drop to negligible values and generally fall below audibility. Finally, the dynamic nature of most types of music and voice broadcast programming also inherently tends to aurally mask these low-frequency components.

Compared with the standard static-receiver synchronous AM reception case discussed previously, the presence of these sub-Hertz beats in mobile listening environments typically causes a degradation (i.e., increase) in the overall beat-audibility of only about 1–2 dB compared with the curves in FIG. 5. It is important to understand that virtually all of the major benefits of synchronous operation are still retained even for the mobile listener.

The implementation of a synchronous single-frequency network for AM broadcasting will now be described. The use of highly synchronized stations (i.e., those with carrier frequencies differing by roughly 0.001 Hz or less) also permits the practical implementation of a novel method for multi-station networking for AM broadcasting. In a preferred embodiment of one possible implementation of this invention, multiple co-channel broadcast transmitters are both tightly frequency-locked via the aforementioned techniques and are concurrently modulated by a common audio program feed available from a global source such as a geostationary satellite. The audio program is intended to contain material suitable for a "national" network feed which would be broadcast via the AM band to a large geographical region, e.g., the entire continental United States. Although there are numerous opportunities for delay variations in the program audio signal processing chains, including satellite and/or microwave transmission links, telephone lines, audio processing devices, and the audio paths of the transmitters themselves, it is currently practical to expect that the composite delays in the program audio of all stations in the network can be matched or equalized, so that the final audio modulation signals sent from the transmitters are equally delayed from the central network source. This is fairly easily accomplished if the main network feed originates from a common single geostationary satellite (about 40,000 km up). The actual path distances to each station's receiver are then calculated and the equivalent delays (on the order of 120 ms at the speed of light) are calculated. Additional terms are added for the internal delays of the satellite receivers, and corrections are included if all the receivers in the network are not all identical. Finally, the total delays through the entire studio, relay links, and transmitting plant are added in for each station. After all the stations' total audio throughput delays are determined, each station in the group is individually compensated to the common desired value by alteration of the equipment as necessary. Alternatively, each station in the group can be individually delay-equalized via conventional commercially available audio-delay units, which are usually digital in nature. Once all the stations in the network are finally adjusted to the same overall audio delay figure, the network is ready for wide-area co-channel broadcasting.

Figure 7:
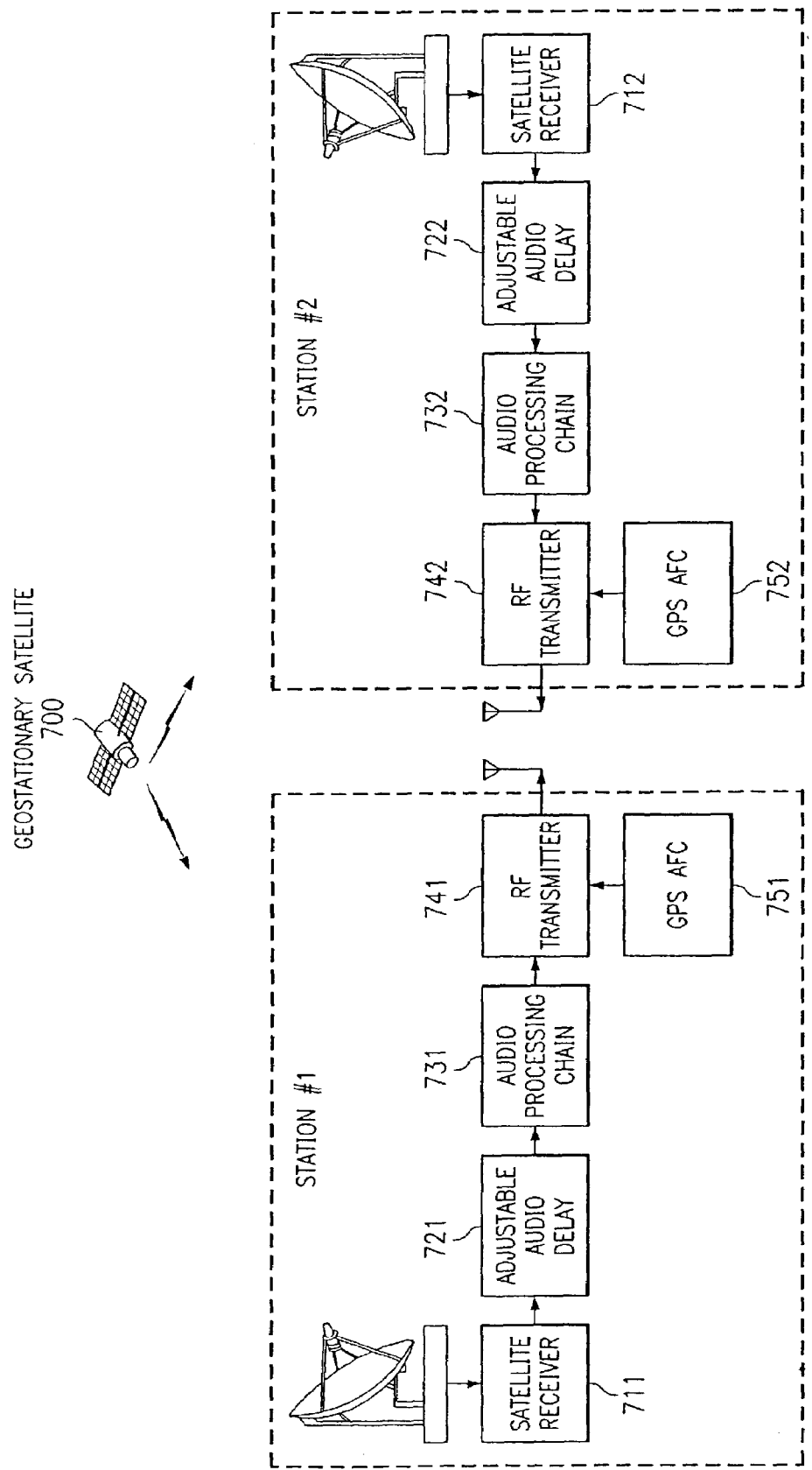
FIG. 7 illustrates a schematic block diagram of a two-station implementation of a single-frequency synchronous network, including a common satellite audio source and adjustable audio-delay units inserted into a satellite audio reception and processing chain at each station, representing an embodiment of the invention.

FIG. 7 is a block diagram of a representative two-station implementation of a single-frequency synchronous network, including the common satellite audio source and the adjustable audio-delay units inserted into the satellite audio reception and processing chain at each station. A geostationary satellite 700 is linked to satellite receivers 711 and 712. The satellite receivers 711 and 712 are coupled to adjustable audio delay units 721 and 722, respectively. The units 721 and 722 are coupled to audio processing chains 731 and 732, respectively. The chains 731 and 732 are coupled to RF transmitters 741 and 742, respectively. A GPS AFC module 751 for station #1 is coupled to the RF transmitter 741. A GPS AFC 752 module for station #2 is coupled to the RF transmitter 742. The adjustable-delay units 721 and 722 can be set to equalize the total end-to-end system audio delays in an optimum fashion to maximize audio quality for a desired listening area.

In general, the phasing of the composite (summed) signals will be highly random in the presence of significant skywave components, although this condition is generally restricted to the evening and nighttime hours; here, the typical skywave fading cycles can be on the order of 10–45 seconds in duration and can occasionally be severe in amplitude variations (>30 dB). In this last instance, where a dominant signal is present via skywave over a large area (e.g., the classical AM nighttime "clear-channel" scenario), it may also be feasible to augment coverage in highly noisy urban areas with local repeaters of fairly low power but nevertheless with local signal strengths at least on the order of that of the distant skywave signal (during its stronger, unfaded epochs). These repeaters would be dynamically (though loosely) RF phase-locked to the incoming dominant-station signal. The local audio modulation would also be time-delay locked to the incoming signal, though its source would still preferably be the same geostationary satellite as cited previously in the earlier general networking scenario. This delay adjustment would permit matching of the audio timing by adding a delay to the local repeater's transmitter (typically from 2–10 ms) to correspond to the arrival of the skywave signal from its originating source. The ongoing dynamic computation of the phases and delays would generally require the establishment of a monitoring station well out of the targeted urban area to cleanly receive the master skywave signal in a relatively quiet venue; the desired correction signals would then be developed and telemetered back to the urban repeater facility.

Figure 8:
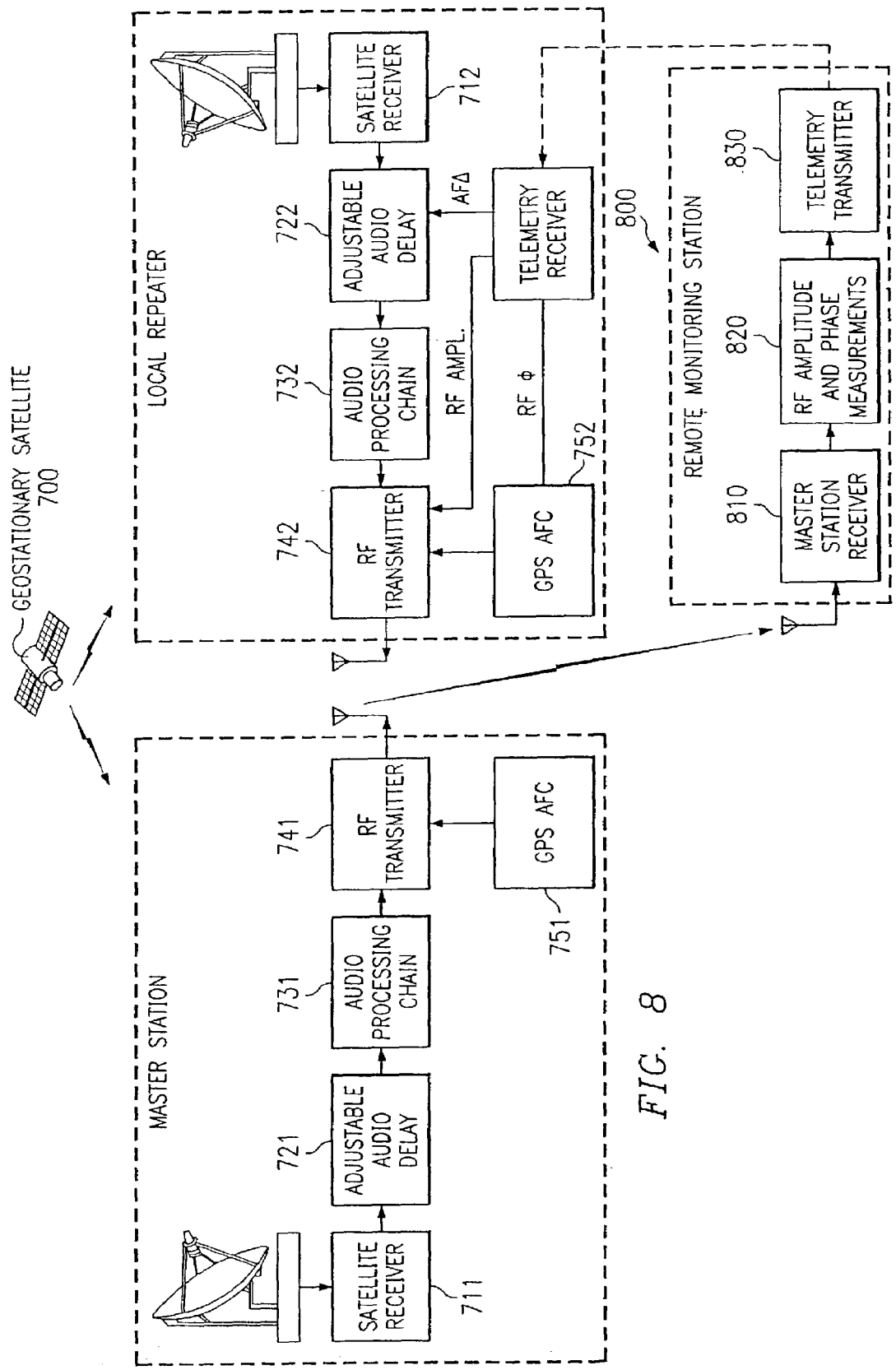
FIG. 8 illustrates a block diagram of a two-station implementation of a single-frequency synchronous repeater network, showing the master station at left and the local "urban" repeater with transmitter controls at right, including at lower right a remote monitoring site used to provide dynamic correction information on the received master station's signal conditions to the local repeater unit, representing an embodiment of the invention.

FIG. 8 is a block diagram of a two-station implementation of a single-frequency synchronous repeater network, showing the master station at left and the local "urban" repeater with its dynamic transmitter controls at right. Included at lower right is the "quiet" remote monitoring site equipment used to obtain measurements of the RF amplitude and phase, plus the relative audio delay due to RF skywave propagation effects. A remote monitoring station 800 includes a master station receiver 810 that is coupled to an RF amplitude and phase measurements module 820 which is in-turn coupled to a telemetry transmitter 830. The telemetry transmitter is for sending parameters to the local repeater. These parameters can be telemetered back to the local repeater via radio, data link, phone line, or other suitable data pipeline to provide dynamic correction information on the received master station's signal conditions. The local repeater includes a telemetry receiver 840 that is coupled to the RF transmitter 742 and the GPS AFC 752.

The telemetry receiver 840 at the local repeater site conveys to the transmitter 742 the RF amplitude information from the master station's signal to adjust the RF output power from the local repeater. The RF phase ($\phi$) data is conveyed from the receiver 840 to the GPS-controlled carrier automatic frequency-control (AFC) loop 752 to slowly adjust the local transmitter's phase to roughly follow the phase of the master signal. The RF amplitude is used in the RF transmitter to control the power of the output. Finally, the propagation delay of the master signal is compensated in the audio chain (the AF Δ line) by altering the audio delay as required to bring the local audio modulation back into time coincidence with the received master signal's audio.

Besides improved signal-to-noise ratio and more stable CQUAM stereo performance in the noisy urban environment, the use of the augmenting repeaters should via their stable locally sourced signals can also effectively eliminate the problem of deep ionospheric amplitude fading and also greatly reduce modulation distortion due to frequency-selective (carrier-versus-sideband) fading of the skywave signal by "filling-in" the lapses in the skywave component with the much more stable-amplitude local signals. In addition, in the case of mobile receivers even in areas of significant signal overlap (i.e., where the ratio of the local and distant co-channel network AM signals is within ±12 dB), the presence of identical (and time-equalized) audio modulations on the two carriers is extremely effective at masking the Doppler-induced beats; in fact, even at ratios of only 3–4 dB, the beats are not discernible at all by most listeners. Finally, the local repeaters can be operated at considerably higher powers during daylight hours to provide local-area co-channel augmentation of the dominant station when skywave propagation is rendered ineffective by the usually high daytime ionospheric losses.

The invention can also be included in a kit. The kit can include some, or all, of the components that compose the invention. The kit can be an in-the-field retrofit kit to improve existing systems that are capable of incorporating the invention. The kit can include a connector (e.g., a cable) to couple a module containing the invention to a broadcast transmitter. The kit can include software, firmware and/or hardware for carrying out the invention. The kit can also contain instructions for practicing the invention. Unless otherwise specified, the components, software, firmware, hardware and/or instructions of the kit can be the same as those used in the invention.

The term approximately, as used herein, is defined as at least close to a given value (e.g., preferably within 10% of, more preferably within 1% of, and most preferably within 0.1% of). The term substantially, as used herein, is defined as at least approaching a given state (e.g., preferably within 10% of, more preferably within 1% of, and most preferably within 0.1% of). The term coupled, as used herein, is defined as connected, although not necessarily directly, and not necessarily mechanically. The phrase broadcast program, as used herein, is defined as the content of a signal. The phrase computer program, as used herein, is defined as a sequence of instructions designed for execution on a computer system. A computer program, may include a subroutine, a function, a procedure, an object method, an object implementation, an executable application, an applet, a servlet, a source code, an object code, a shared library/dynamic load library and/or other sequence of instructions designed for execution on a computer system. The terms including and/or having, as used herein, are defined as comprising (i.e., open language). The terms a or an, as used herein, are defined as one or more than one. The term another, as used herein, is defined as at least a second or more.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

A basic configuration of the GPS-disciplined oscillator is simple, as shown in FIG. 1. A GPS satellite antenna 101 is connected to a multichannel GPS satellite receiver 110. A reference frequency output from the multichannel GPS satellite receiver 110 is fed to a first divider 121. The output from the first divider 121 is fed to a second divider 122. The output from the second divider 122 is fed to a third divider 123. The output from the third divider 123 is fed to a phase comparator 130. A loop low-pass filter 140 is coupled to the phase comparator 130. A low-noise amplifier 150 is coupled to the loop low-pass filter 140. A voltage-controlled crystal oscillator 160 (VCXO) is coupled to the low-noise amplifier 150. The output of the VCXO 160 is sent to the phase comparator 130 via a buffer/comparator 170 and a programmable divider 180. The output of the VCXO 160 is also sent to a transformer/coupling coil 195 via an RF output buffer 190.

The oscillator 160 may be a more-or-less conventional high-stability quartz crystal type, usually ovenized or otherwise temperature-compensated. To counter long-term drifts, aging effects, and loading-circuit changes, the basic oscillator can be slightly adjusted electronically (e.g., varactor diode) or mechanically (e.g., turning a capacitor-adjustment shaft) to track the high-precision source of standard frequency obtained from the GPS satellite receiver 110, typically at either 5,000 or 10,000 MHz. This very stable local reference frequency is then used as a clock for a standard digitally implemented frequency synthesizer (not shown), which is programmed to generate the specific (AM broadcast) transmitter carrier frequency desired. The stability of the disciplining source, typically ~1 part in $10^{11}$, is thus transferred to the final AM transmitter carrier output frequency.

Generally, an AM radio listener during the evening and nighttime hours, and to a lesser extent in the early morning, receives undesired skywave signals from several distant stations as well as the desired local (groundwave) signal. If all of these signals are within about 0.01–0.001 Hz of each other, any resulting carrier beats will be of such long periods that the beats will be effectively suppressed by the action of the receiver's AGC/AVC circuitry and will thus be unnoticeable to the listener. For best results, all stations on the channel in question (at least those with signals above the noise floor at the receiver) should be closely frequency-locked to a common precise reference as just described, or the beats will not be completely eliminated.

In FIG. 1, the multichannel GPS satellite receiver 110 outputs a standard reference frequency, generally either 10,000 or 5,000 MHz in commercially available units. For the case of a first preferred embodiment of the invention, the output at 10,000 MHz is applied to a synchronous digital divider chain 121, 122, and 123 to produce the desired phase-comparison frequency (and, thus, step size) to the overall phase-locked loop (PLL) type of frequency synthesizer to develop the precision AM transmitter carrier frequency source. In the embodiment of FIG. 1, three successive stages of divide-by-10 are cascaded to provide the overall ÷1000 frequency-division ratio to achieve the desired 10,000-kHz phase-comparison reference frequency. The dividers 121, 122 and 123 and the phase comparator 130 (detector) can be implemented with any suitably fast circuit technology (i.e., TTL, HCMOS, etc.) but are optimally fabricated with ECL devices, which possess superior speed, noise immunity (especially when configured differentially), and excellent jitter performance. In addition, ECL devices typically exhibit more constant power consumption and produce far less switching noise on power-supply busses than other industry-standard logic families. Likewise, the "programmable divider" block 121, 122 and 123 is optimally implemented with high-speed, bipolar-transistor emitter-coupled logic (ECL), although high-speed CMOS versions of such circuits are presently far more prevalent in the industry. The programmable divider 180 is selected to have the ratio needed to divide the specified carrier frequency (here, for example, 1240 kHz) down to the desired phase-comparison frequency of 10 kHz; thus, here the ratio is set to 124. [Obviously, for international AM broadcasting applications, where stations may be allocated at intervals of 5 kHz, 9 kHz, etc. (all multiples of 1 kHz), the phase comparator 180 would probably operate at a frequency of 1 kHz (to achieve this smaller frequency-step size) and the two divider chains would each be modified to raise their overall ratios by a factor of ten.] The loop low-pass filter 140 (LPF), low-noise amplifier 150, and high-stability voltage-controlled oscillator 160 should be designed to achieve low-noise, low-jitter performance of the locked loop, to meet the high-accuracy, high-stability requirements of the application. These devices are well known in the precision frequency-source art and are therefore not discussed further in depth. It should be noted, though, that modem precision crystal oscillators, especially those employing the newer, more stable SC-cut quartz crystals, currently rival the much more expensive rubidium- and even cesium-based units traditionally used for such applications as the one at hand. Closing the loop, a fast buffer/comparator 170 stage squares up the usually sinusoidal output of the main oscillator and develops logic levels suitable for driving the following programmable divider 180 circuitry. A disadvantage of this overall approach to implementing the precision GPS-disciplined carrier oscillator is that the VCXO 160 block must be custom-configured (i.e., the high-grade crystal must be lapped or ground) to the desired station carrier frequency.

Example 2

Figure 2:
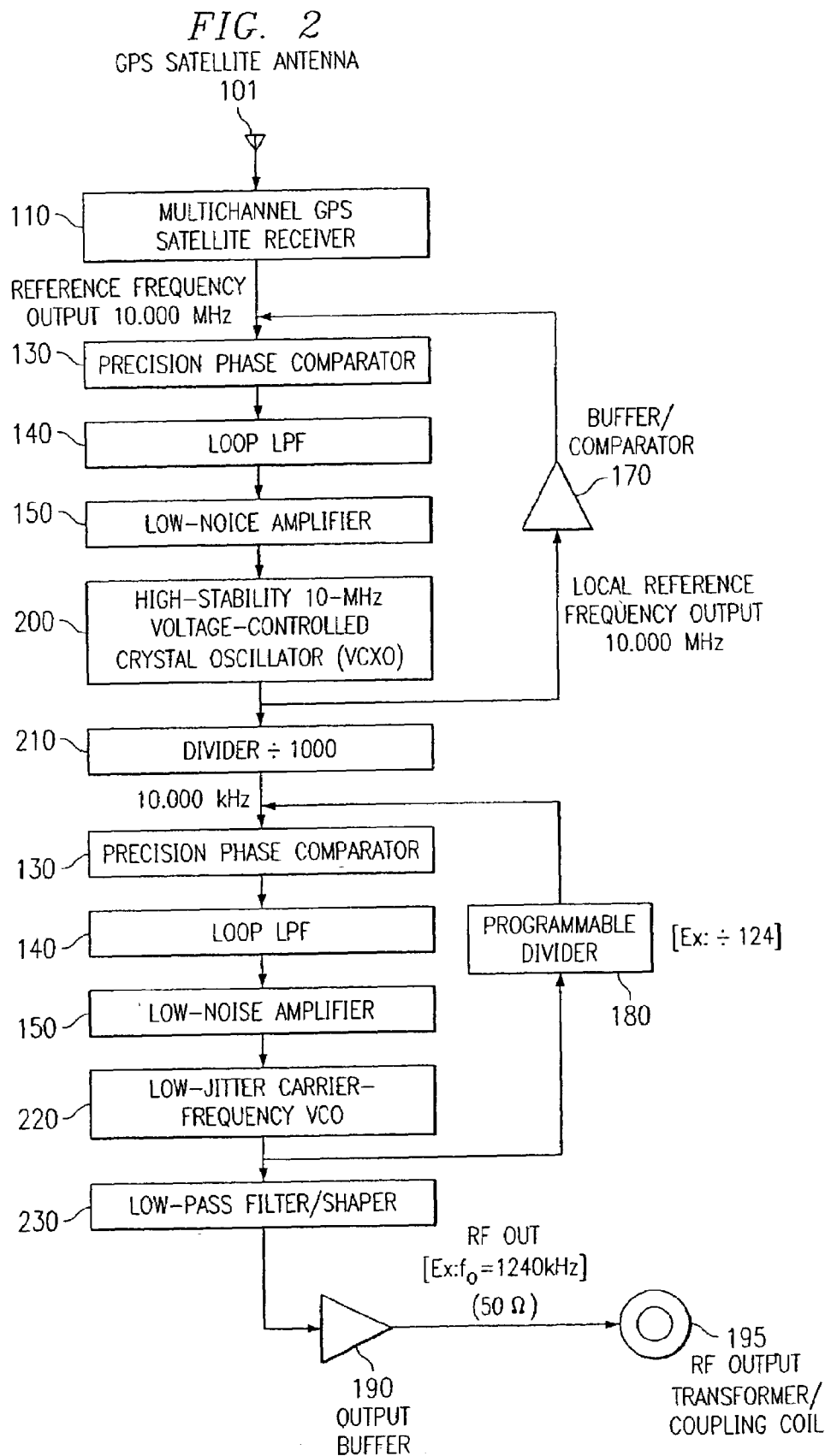
FIG. 2 illustrates a schematic block diagram of a basic configuration of a high-accuracy, near-zero-drift, two-loop GPS-disciplined carrier-frequency generator system with a frequency-synthesizer control circuit, representing an embodiment of the invention.

A less expensive version of the technique is illustrated in FIG. 2, where the GPS-derived reference frequency is used to discipline a local high-quality VCXO 200 (or other super-stable oscillator) with the same nominal frequency. A divider 210 is used to divide the reference frequency (here, 10.000 MHz) down to the common 10-kHz step size, and the final transmitted carrier frequency is synthesized in a conventional manner via a low-jitter VCO 220, which can be a standard square-wave oscillator. The VCO 220 drives a switched-integrator stage 230 to produce a triangular wave at the same frequency, which in turn is soft-clipped (shaped) to a very nearly sinusoidal waveform to yield the final low-distortion output carrier frequency. The principal advantage to this second approach is the elimination of the custom-manufactured carrier-frequency crystal; as a result, this design is completely standardized, regardless of the particular channel desired. An internal programmable switch or logic device (not shown) adjusts the internal divide ratio and thus selects the specific final RF carrier-frequency value.

Example 3

A third variation of the overall precision-control scheme is shown in FIG. 3, where the GPS-derived reference frequency is feed to a multiplier 310 to be multiplied to serve as the high-frequency clock (here, 200 MHz) for a fast digital numerically controlled oscillator (NCO) circuit 320, such as that included in the AD9854 chip from Analog Devices, Inc. or in numerous other similar chips from several other manufacturers (e.g., Intel, Intersil, and Philips). Here, the main NCO 320 accumulates digital phase at its clocking rate; the phase data is presented continually to a phase-to-amplitude data converter 330 [read-only memory] ("Sine-ROM") block, which outputs a series of amplitude values corresponding to a pure sine-wave at the programmed frequency. These data words, typically at resolutions of from 8 to 14 bits, are then fed to a high-speed digital-to-analog (D/A) converter 340, which generates the stepwise analog carrier output signal. A final downstream low-pass filter/waveshaper stage smooths the output signal and reduces distortion and spurious components to negligible levels; the final RF output amplifier boosts the signal power to a level adequate to drive the associated RF transmitter circuitry. For ease and reliability in interfacing the reference signal into an existing transmitter's oscillator stage, an inductively coupled drive loop is typically employed around one of the leads to the existing crystal to injection-lock the transmitter crystal to the external reference. Then, if the reference signal fails for any reason, the transmitter will simply "slip" back to its original frequency, without any interruption in its broadcast transmission. Alternatively, the GPS-disciplined master reference frequency (at typically 5.000 or 10.000 MHz) could be used as an external reference for the frequency synthesizer subsystem generally employed in more modern AM transmitter designs.

PRACTICAL APPLICATIONS OF THE INVENTION

A practical application of the invention that has value within the technological arts is disciplining standard AM broadcasting (540–1700 kHz), international shortwave broadcasting, and analog and digital television broadcasting in both U.S. and foreign venues. Other applications include non-broadcast radio voice, video, and data communications. There are virtually innumerable uses for the invention, all of which need not be detailed here.

ADVANTAGES OF THE INVENTION

An approach to carrier discipline, representing an embodiment of the invention, can be cost effective and advantageous for at least the following reasons. The extremely tight frequency lock (e.g., approximately 1 part in $10^9$ or better, preferably approximately 1 part in $10^{11}$) permits the substantial elimination of audible and even sub-audible beats between the local (desired) station's carrier signal and one or more distant (interfering) stations' carriers, usually received via skywave propagation during the evening and nighttime hours. As described above, the carrier-beat component cause annoying modulations of the desired station's audio at the receiver and concurrent distortion of the audio modulation from the distant station(s) and often cause listeners to "tune out" due to the poor reception quality. Significant reduction or elimination of the carrier-beat components and the related interference effects will greatly enlarge the effective listening area of the desired station and simultaneously reduce the corresponding interference of the local transmitter to the distant stations' listeners as well. In addition, the invention provides a particular benefit to AM stereo reception using the FCC-standard CQUAM system by minimizing the phase-rotation of the received carrier induced by co-channel interfering signals. Also, the automatic frequency-control methodology described herein requires no periodic recalibration, has essentially zero long-term drift, and can employ alternate wide-area frequency references of suitable accuracy, including broadcasts from GOES satellites, WWVB, LORAN-C, digital data networks, and equivalent sources.

All the disclosed embodiments of the invention disclosed herein can be made and used without undue experimentation in light of the disclosure. Although the best mode of carrying out the invention contemplated by the inventors is disclosed, practice of the invention is not limited thereto. Accordingly, it will be appreciated by those skilled in the art that the invention may be practiced otherwise than as specifically described herein.

Further, the individual components need not be combined in the disclosed configurations, but could be combined in virtually any configuration. Further, variation may be made in the steps or in the sequence of steps composing methods described herein. Further, although the synchronization circuitry described herein can be a separate module, it will be manifest that the synchronization circuitry may be integrated into the system with which it is (they are) associated. Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method, comprising synchronizing carrier frequencies of a group of co-channel amplitude-modulated broadcast signals,
    wherein synchronizing includes feeding a reference frequency output from a multichannel receiver to a phase lock loop and
    wherein synchronizing includes substantial elimination of audible and sub-audible beats between a local desired station's carrier signal and one or more distant interfering stations' carriers.

2. The method of claim 1, wherein synchronizing includes repetitively synchronizing.

3. The method of claim 2, wherein repetitively synchronizing includes continuously synchronizing.

4. The method of claim 1, wherein synchronizing carrier frequencies of the group of co-channel amplitude-modulated broadcast signals includes synchronizing carrier frequencies of the group of co-channel amplitude-modulated broadcast signals to a remote reference frequency.

5. The method of claim 4, wherein the remote reference frequency includes a demodulated reference frequency.

6. The method of claim 4, wherein synchronizing includes dividing the remote reference frequency, comparing the divided remote reference frequency to a divided carrier-frequency signal and adjusting a phase of the divided carrier-frequency signal to approach a phase of the divided remote reference frequency.

7. The method of claim 4, wherein synchronizing includes comparing the remote reference frequency to a local reference frequency, adjusting a phase of the local reference frequency to approach a phase of the remote reference frequency, dividing the local reference frequency, comparing the divided local reference frequency to a divided carrier-frequency signal and adjusting a phase of the divided carrier-frequency signal to approach a phase of the divided local reference frequency.

8. The method of claim 4, wherein synchronizing includes comparing the remote reference frequency to a local reference frequency, adjusting a phase of the local reference frequency to approach a phase of the remote reference frequency, multiplying the local reference frequency and controlling a numerically controlled oscillator with the multiplied local reference frequency.

9. The method of claim 4, further comprising deriving the remote reference frequency from at least one source selected from the group consisting of GPS satellites, GOES satellites, LORAN-C, OMEGA, WWVB, WWV, WWVH, CHU, and CDMA cell-phone base stations.

10. The method of claim 4, further comprising deriving the remote reference frequency from a digital data network.

11. The method of claim 4, further comprising synchronizing another carrier frequency of another broadcast signal with the remote reference frequency, wherein both the carrier frequency and the another carrier frequency are of a same nominal frequency.

12. The method of claim 11, further comprising modulating both the carrier of the broadcast signal and the another carrier of the another broadcast signal with a common audio program feed.

13. The method of claim 12, further comprising equalizing the control of the carrier average phase of the broadcast signal and the control of the another carrier average phase of the another broadcast signal.

14. The method of claim 12 wherein the modulation of the carrier of the broadcast signal and the modulation of the another carrier of the another broadcast signal are substantially equally delayed from a central network source.

15. The method of claim 14, further comprising augmenting at least one member selected from the group consisting of the broadcast signal and the another broadcast signal with a repeater of the same nominal frequency.

16. The method of claim 4, wherein synchronizing carrier frequencies of the group of co-channel amplitude-modulated broadcast signals to a remote reference frequency includes synchronizing carrier frequencies of the group of co-channel amplitude-modulated broadcast signals to a common remote source.

17. A computer program, comprising computer or machine readable program elements translatable for implementing the method of claim 1.

18. The method of claim 1, wherein the group of co-channel amplitude-modulated broadcast signals include amplitude-modulated analog audio broadcast signals.

19. The method of claim 1, wherein the group of co-channel amplitude-modulated broadcast signals include amplitude-modulated stereo audio broadcast signals.

20. The method of claim 1, wherein the group of co-channel amplitude-modulated broadcast signals include amplitude-modulated analog television broadcast signals.

21. The method of claim 1, wherein the group of co-channel amplitude-modulated broadcast signals include amplitude-modulated digital television broadcast signals.

22. A method, comprising
synchronizing a carrier frequency of a broadcast signal with a remote reference frequency, wherein synchronizing carrier frequencies of the group of co-channel amplitude-modulated broadcast signals includes synchronizing carrier frequencies of the group of co-channel amplitude-modulated broadcast signals to a remote reference frequency;
synchronizing another carrier frequency of another broadcast signal with the remote reference frequency, wherein both the carrier frequency and the another carrier frequency are of a same nominal frequency;
modulating both the carrier of the broadcast signal and the another carrier of the another broadcast signal with a common audio program feed, wherein the modulation of the carrier of the broadcast signal and the modulation of the another carrier of the another broadcast signal are substantially equally delayed from a central network source;
augmenting at least one member selected from the group consisting of the broadcast signal and the another broadcast signal with a repeater of the same nominal frequency; and
monitoring a master skywave signal from the central network source.

23. The method of claim 22, wherein monitoring the master skywave signal includes monitoring an average phase of the master skywave signal.

24. The method of claim 22, wherein monitoring the master skywave signal includes monitoring an average amplitude of the master skywave signal.

25. The method of claim 22, wherein monitoring the master skywave signal includes monitoring an average delay of the master skywave signal.

26. An apparatus, comprising:
a first multichannel reference signal receiver;
a first phase comparator coupled to the first multichannel reference signal receiver;
a first voltage-controlled oscillator coupled to the first phase comparator;
a first amplitude-modulated radio-frequency output coupled to the first voltage-controlled oscillator;
a second multichannel reference signal receiver;
a second phase comparator coupled to the second multichannel reference signal receiver;
a second voltage-controlled oscillator coupled to the second phase comparator; and
a second amplitude-modulated radio-frequency output coupled to the second voltage-controlled oscillator,
wherein the first amplitude-modulated radio-frequency output and the second amplitude-modulated radio-frequency output provide a group of co-channel signals whose carrier frequencies are synchronized to substantially eliminate audible and sub-audible beats between a local desired station's carrier signal and one or more distant interfering stations' carriers.

27. The apparatus of claim 26, further comprising a first divider circuit coupled between the first multichannel reference signal receiver and the first phase comparator; and a second divider circuit coupled between the first phase comparator and the first voltage-controlled oscillator.

28. The apparatus of claim 26, further comprising a first divider circuit coupled between the first voltage-controlled oscillator and the first amplitude-modulated radio-frequency output; another phase comparator coupled between the first divider circuit and the first amplitude-modulated radio-frequency output; and a second divider circuit coupled between the another phase comparator and the first amplitude-modulated radio-frequency output.

29. The apparatus of claim 26, wherein the first multichannel reference signal receiver includes a multichannel global positioning system satellite receiver.

30. The apparatus of claim 26, wherein the first multichannel reference signal receiver derives the reference frequency from at least one source selected from the group consisting of GPS satellites, GOES satellites, LORAN-C, OMEGA, WWVB, WWV, WWVH, CHU, and CDMA cell-phone base stations.

31. The apparatus of claim 26, wherein the first multichannel reference signal receiver derives the reference frequency from a digital data network.

32. The apparatus of claim 26, further comprising an antenna coupled to the first multichannel reference signal receiver.

33. The apparatus of claim 26, further comprising a transmitter coupled to the first radio frequency output.

34. The apparatus of claim 33, further comprising an antenna coupled to the transmitter.

35. The apparatus of claim 26, further comprising a low-pass filter coupled between the first multichannel reference signal receiver and the first phase comparator and an amplifier coupled between the low-pass filter and the first phase comparator.

36. The apparatus of claim 26, further comprising a buffer/comparator coupled between the first phase comparator and the first voltage-controlled oscillator.

37. The apparatus of claim 26, further comprising an output buffer coupled between the first voltage-controlled oscillator and the first amplitude-modulated radio-frequency output.

38. A method for broadcasting which comprises utilizing the apparatus of claim 26.

39. A broadcast system, comprising the apparatus of claim 26.

40. A network, comprising the broadcast system of claim 39.

41. The network of claim 40, further comprising a repeater to augment coverage in a local area, wherein the repeater is coupled to one member selected from the group consisting of the first amplitude-modulated radio-frequency output and the second amplitude-modulated radio-frequency output.

42. The network of claim 41, further comprising a monitor to receive a master skywave signal, wherein the monitor is coupled to one member selected from the group consisting of the first multichannel reference signal receiver and the second multichannel reference signal receiver.

* * * * *